United States Patent
Kaizuka et al.

(10) Patent No.: US 6,436,203 B1
(45) Date of Patent: *Aug. 20, 2002

(54) CVD APPARATUS AND CVD METHOD

(75) Inventors: Takeshi Kaizuka, Utsunomiya; Takashi Horiuchi, Yamanashi-ken; Masami Mizukami, Kofu; Takashi Mochizuki, Kofu; Yumiko Kawano, Kofu; Hideaki Yamasaki, Nirasaki, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/551,393

(22) Filed: Apr. 18, 2000

Related U.S. Application Data

(62) Division of application No. 09/092,060, filed on Jun. 5, 1998, now Pat. No. 6,089,184.

(30) Foreign Application Priority Data

Jun. 11, 1997 (JP) ............................................. 9-167887

(51) Int. Cl.⁷ ................................................. B05D 1/36
(52) U.S. Cl. ....................... 148/512; 427/124; 427/252; 427/255.7
(58) Field of Search .......................... 148/512; 427/124, 427/252, 255.7

(56) References Cited

U.S. PATENT DOCUMENTS

| | | | | |
|---|---|---|---|---|
| 5,273,775 A | * | 12/1993 | Dyer et al. | 427/252 |
| 5,464,666 A | * | 11/1995 | Fine et al. | 427/252 |
| 5,534,069 A | * | 7/1996 | Kuwabara et al. | 118/719 |
| 5,627,102 A | * | 5/1997 | Shinriki et al. | 437/192 |
| 6,077,571 A | * | 6/2000 | Kaloyeros et al. | 427/252 |
| 6,089,184 A | * | 7/2000 | Kaizuka et al. | 118/723 VE |
| 6,139,697 A | * | 10/2000 | Chen et al. | 427/252 |

* cited by examiner

Primary Examiner—George Wyszomierski
(74) Attorney, Agent, or Firm—Oblon, Spivak, McClelland, Maier & Neustadt, P.C.

(57) ABSTRACT

The present invention provides a CVD apparatus and a CVD method for use in forming an Al/Cu multilayered film. The Al/Cu multilayered film is formed in the CVD apparatus comprising a chamber for placing a semiconductor wafer W, a susceptor for mounting the semiconductor wafer W thereon, an Al raw material supply system for introducing a gasified Al raw material into the chamber and a Cu raw material supply system for introducing a gasified Cu raw material into the chamber. The Al/Cu multilayered film is formed by repeating a series of steps consisting of introducing the Al raw material gas into the chamber, depositing the Al film on the semiconductor wafer W by a CVD method, followed by generating a plasma in the chamber in which the Cu raw material gas has been introduced and depositing the Cu film on the semiconductor wafer W by a CVD method. The Al/Cu multilayered film thus obtained is subjected to a heating treatment (annealing), thereby forming a desired Al/Cu multilayered film.

10 Claims, 4 Drawing Sheets

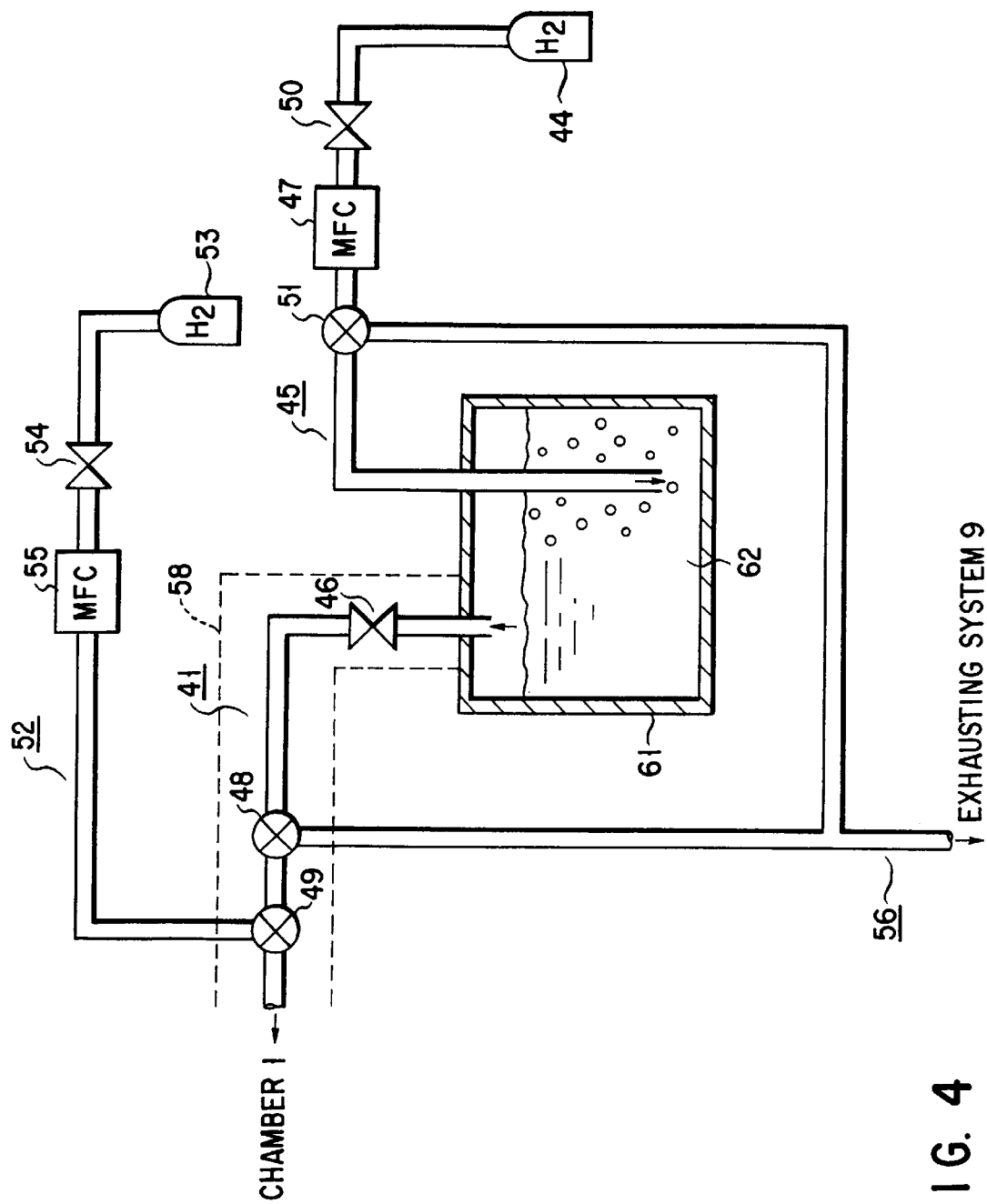
F I G. 4

CVD APPARATUS AND CVD METHOD

This application is a Division of application Ser. No. 09/092,060 filed on Jun. 5, 1998, now U.S. Pat. No. 6,089,184.

BACKGROUND OF THE INVENTION

The present invention relates to a CVD (chemical Vapor Deposition) apparatus and a CVD method, and more particularly, a CVD apparatus and a CVD method for forming an Al/Cu multilayered film.

In a semiconductor device, wiring (e.g., metal) is generally formed on a device formation region on a silicon semiconductor wafer by, for example, etching an Al—Cu film formed by sputtering using an Al-0.5 wt % Cu-target.

Recently, with the trend toward high integration of the semiconductor device, it has been desired to reduce the wiring width. However, it is difficult for a hitherto-used sputtering method to form a fine wiring which will be required by a design rule in future.

Then, as a technique replaceable for the sputtering method, a CVD method has been studied. Since the CVD method includes a vapor deposition step, a film is easily formed on a complicated substrate surface and minute portions such as portions having a large aspect ratio and contact holes.

However, it is difficult to form the Al—Cu film suitable for wiring by the CVD method.

To form the Al—Cu film, conventionally employed is a method in which a Cu component is added to an Al film (CVD) formed by the CVD method. In the conventional method, the Cu component is diffused into the Al film (CVD) by depositing an Al—Cu film or a Cu film on the Al film (CVD) by sputtering and annealing the obtained film.

The Al—Cu film of this type is reported in "Symposium on VLSI technology Digest of Technical Papers (1996), p42".

In the case where the Cu component is dispersed into the Al film (CVD) by use of a single wafer process system having a multichamber type, two process chambers are required; one is to form the Al film by the CVD method and the other is to form the Al—Cu film or the Cu film by sputtering. However, film-formation has to be performed two times by transporting a single wafer between two process chambers. As a result, the throughput thereof inevitably decreases.

To overcome the decrease in throughput, if a plurality of chambers are prepared for each of the Al-film formation and Al—Cu film or the Cu film formation, the entire apparatus becomes quite large, raising a manufacturing cost.

BRIEF SUMMARY OF THE INVENTION

An object of the present invention is to provide a CVD apparatus and a CVD method capable of obtaining an Al/Cu multilayered film with a high throughput but without increasing the size of the apparatus.

The present invention provides a CVD (chemical vapor deposition) apparatus comprising:

a chamber capable of maintaining vacuum conditions having an exhausting system;

a susceptor disposed in the chamber, for mounting an object to be processed;

an Al raw material supply system having a first passage for introducing a gasified Al raw material into the chamber, for forming an Al film;

a Cu raw material supply system having a second passage for introducing a gasified Cu raw material into the chamber, for forming a Cu film, the first passage being independent of the second passage; and exhausting means for vacuum-exhausting a gas including the gasified raw material introduced into the chamber;

wherein the Al film (formed of the Al raw material gas) and the Cu film (formed of the Cu raw material gas) are alternately stacked one upon the other by chemical vapor deposition (CVD) on a surface of the object to be processed by introducing the Al raw material gas or the Cu raw material gas alternately.

The Al raw material supply system of the CVD apparatus comprises an Al raw material supply line for supplying an Al raw material. The Al raw material supply line includes:

Al raw material gas generating means for generating a predetermined amount of an Al raw material gas from a liquid-state Al raw material contained in a vessel by bubbling with a predetermined carrier gas or direct gasification;

Al gas bypass means for either supplying the generated Al raw material gas to the Al raw material supply system or exhausting the generated Al raw material gas outside using the exhausting means by switch operation of a valve;

first gas purge means for purging a remaining gas in the chamber or in a gas pipe by supplying a predetermined carrier gas either from the Al raw material gas supply line to the chamber or from the Al raw material supply line to the Al raw material gas bypass means; and Al raw material switching means for switching either between the Al raw material gas bypass means and the Al raw material supply line or between the first gas purge means and the Al raw material supply line.

The Cu raw material supply system comprises a Cu raw material supply line for supplying a Cu raw material.

The Cu raw material supply line includes

Cu raw material gas generating means for generating a predetermined amount of a Cu raw material gas gasified by heating a solid-state Cu raw material contained in a vessel with the aid of a predetermined carrier gas;

Cu gas bypass means for either supplying the generated Cu raw material gas to the Cu raw material supply system or exhausting the generated Cu raw material gas outside using the exhausting means by switch operation of a valve;

second gas purge means for purging a remaining gas in the chamber or in a gas pipe by supplying a predetermined carrier gas either from the Cu raw material gas supply line to the chamber or from the Cu raw material supply line to the Cu raw material gas bypass means; and Cu raw material switching means for switching either between the Cu raw material gas bypass means and the Cu raw material supply line or between the second gas purge means and the Cu raw material supply line.

The present invention further provides a CVD method of forming a film from the raw material on a surface of an object to be processed which is placed in an atmosphere mainly consisting of a predetermined raw material gas. The CVD method comprises:

a multilayered film formation step for forming an Al/Cu multilayered film by repeating, predetermined times, Al film formation for forming an Al film on a surface of the object to be processed by introducing a gasified Al raw material (Al raw material gas) into the atmosphere and Cu film formation for forming a Cu film on a surface of the object to be processed by introducing a gasified Cu raw material (Cu raw material gas) into the atmosphere, thereby forming an Al/Cu multilayered film in which the Al film and the Cu film are stacked alternately on the object to be processed surface; and a heat treatment step for annealing the Al/Cu multilayered film under predetermined conditions, thereby forming a desired Al/Cu alloy film in which diffusion between the Al film and the Cu film takes place.

As mentioned in the foregoing, the present invention provides a CVD apparatus and a CVD method for use in forming an Al/Cu multilayered film. The Al/Cu multilayered film is formed in the CVD apparatus comprising a chamber for placing an object to be processed, a susceptor for mounting the object to be processed thereon, an Al raw material supply system for introducing a gasified Al raw material into the chamber and a Cu raw material supply system for introducing a gasified Cu raw material into the chamber. The Al/Cu multilayered film is formed by repeating a series of steps consisting of introducing the Al raw material gas into the chamber, depositing the Al film on the object to be processed by a CVD method, followed by introducing the Cu raw material gas into the chamber and depositing the Cu film on the object to be processed by a CVD method. The Al/Cu multilayered film thus obtained is subjected to a heating treatment (annealing), thereby forming a desired Al/Cu multilayered film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing an modified example of the Cu raw material supply system.

DETAILED DESCRIPTION OF THE PREFERRED EMBODIMENT

Now, embodiments of the present invention will be described with reference to the accompanying drawings.

Figure 1:
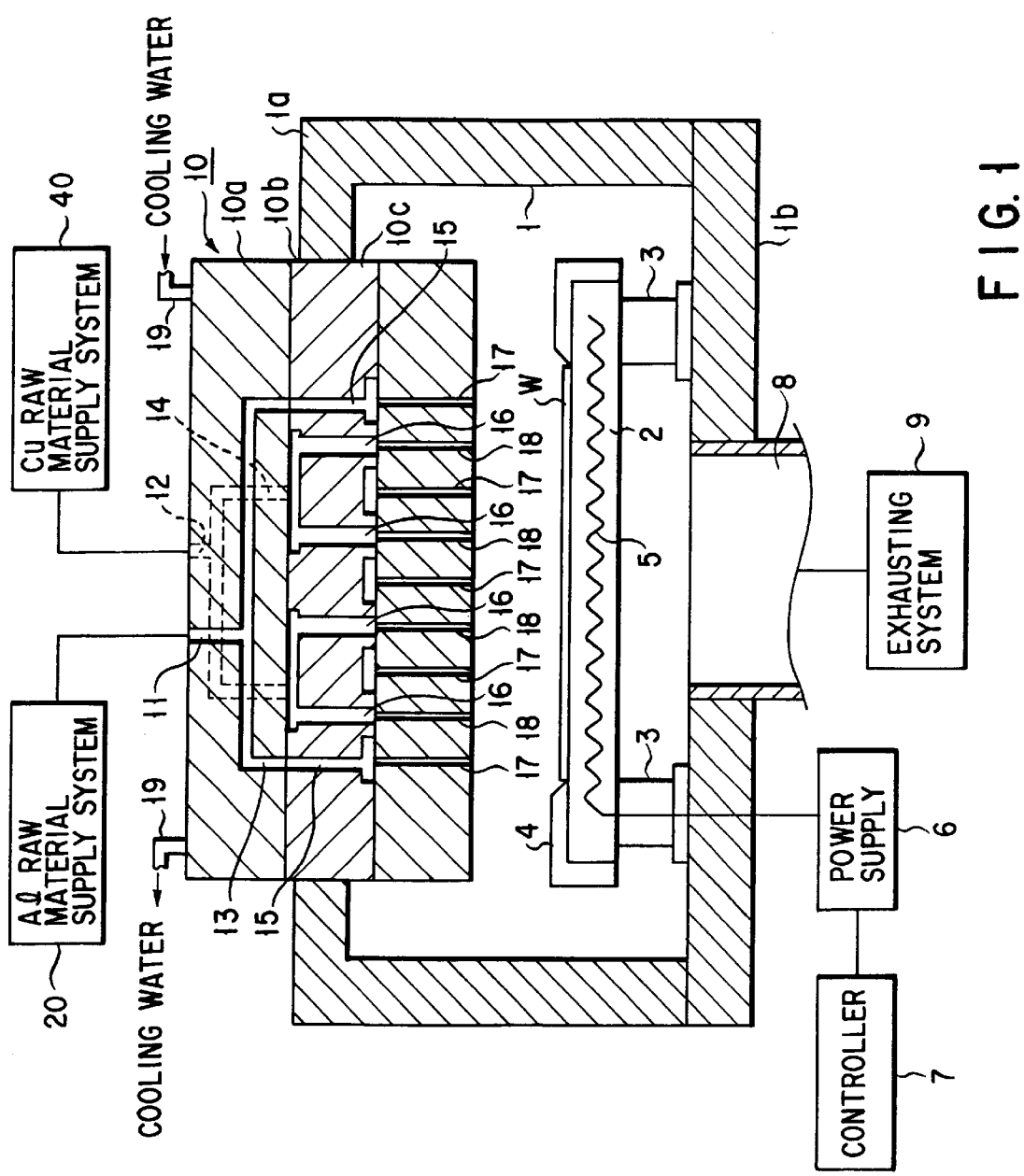
FIG. 1 is a view showing a schematic structure of a CVD apparatus according to an embodiment of the present invention.

FIG. 1 is a schematic cross-sectional view showing a structure of the CVD apparatus according to the present invention.

The CVD apparatus has a chamber 1 formed of aluminium so as to maintain a vacuum state. In the chamber 1, a susceptor 2 is fixed by a supporting member 3 which is immobilized on the bottom portion 1b of the chamber 1. The susceptor 2 is responsible for holding a (object to be processed) such as a semi-conductor wafer W horizontally.

A guide ring 4 is arranged in the outer periphery of the susceptor 2, for guiding the semiconductor wafer W to fit in a holding position while covering the susceptor to prevent an extra film from being deposited.

A heater 5 is embedded inside the susceptor 2. The heater 5 applies heat to the semiconductor wafer W held by the susceptor 2, upon supplying power from the power source 6, thereby raising temperature to a desired value. The temperature of the heater 5 is controlled by a controller 7 via the power source 6 in accordance with a signal sent from a temperature sensor (not shown).

An exhausting port 8 is formed in the bottom portion 1b of the chamber 1. To the exhausting port 8, an exhausting system 9 (a vacuum pump etc.) is connected. The atmosphere and a gas contained in the chamber 1 are exhausted outside by the exhausting system 9. As a result, the pressure is reduced to obtain a predetermined degree of vacuum.

A shower head 10 for supplying a process gas (described later) is provided on the upper cover 1a of the chamber 1. The shower head 10 is constituted of three blocks, namely, upper block 10a, middle block 10b, and the lower block 10c, which are integrated into one body in the vertical direction.

In the upper surface of the upper block 10a, an Al raw material inlet 11 and a Cu raw material inlet 12 are provided. The Al raw material inlet 11 is used for introducing an Al raw material from a Al raw material supply system 20 (described later). The Cu raw material inlet 12 is used for introducing a Cu raw material from a Cu raw material supply system 40 (described later). A pipe extending from the Al raw material inlet 11 is branched into a plurality of Al raw material passages 13 inside the upper block 10a. Each of the branched Al raw material passages 13 is communicated with an Al raw material passage 15 formed in the middle block 10b, and further connected to an Al raw material gas-ejecting orifice 17 in the lower block 10c.

On the other hand, a pipe is arranged extending from the Cu raw material inlet 12 but it is not communicated with Al raw material inlet 11, the Al raw material passage 13, and Al raw material gas-ejecting orifice 17. More specifically, the pipe extending from the Cu raw material inlet 12 is branched into a plurality of Cu raw material passages 14 inside the upper block 10a. Each of the Cu raw material passages 14 is communicated with a Cu raw material passage 16 formed in the middle block 10b, and further connected to a Cu raw material gas-ejecting orifice 18 in the lower block 10c.

As described above, the shower head 10 has the Al raw material supply route and the Cu raw material supply route which are completely independent of each other. The Al and Cu raw material gas-ejecting orifices 17 and 18 are arranged alternately at predetermined intervals. Furthermore, a cooling water passage is formed in the shower head 10. A cooling water is supplied from a water inlet pipe 19 and circulate through the shower head 10, thereby controlling temperature thereof.

The chamber 1 has a transporting system (not shown) for transporting a semiconductor wafer W to the susceptor 2 and has a load-and-unload rock chamber (not shown) for loading and unloading the semiconductor wafer W into and out of the chamber 1.

Figure 2:
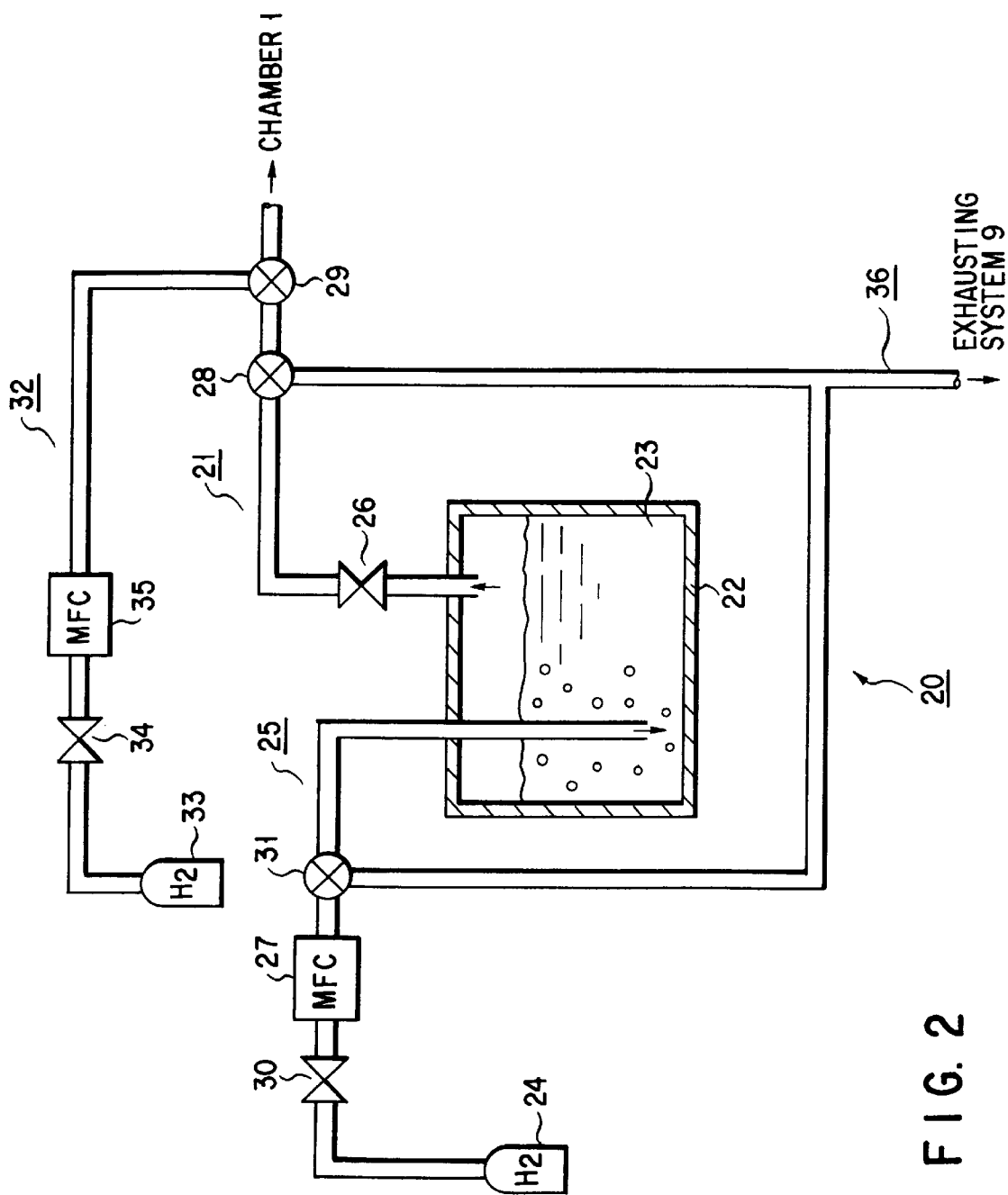
FIG. 2 is a view showing an Al raw material supply system for supplying Al gas into the CVD apparatus shown in FIG. 1.

Now, the Al raw material supply system 20 will be explained with reference to FIG. 2.

The Al raw material supply system 20 has an Al raw material supply line 21 and an Al raw material vessel 22. The Al raw material supply line 21 is connected to the Al raw material inlet 11 of the shower head 10 and responsible for supplying an Al raw material. The Al raw material vessel 22 is filled with an Al raw material such as dimethylaluminium hydride (DMAH). The vessel 22 may be heated.

The Al raw material supply system 20 further comprises a bubbling line 25, a purge line 32, and a bypass line 36. The bubbling line 25 supplies a carrier gas such as $H_2$ gas into the Al raw material vessel 22 to bubble DMAH. Since DMAH is a liquid form at normal temperature, it is gasified by the bubbling operation. The purge line 32 is responsible not only for purging the raw material gas remaining in the Al raw material supply line 21 and in the chamber 1 but also for controlling an inner pressure of the chamber 1 by introducing a gas into the chamber before the raw material gas is supplied. The bypass line 36 is branched from the bubbling line 25 and the purge line 32 and plays a role in exhausting the raw material gas to prevent the raw material gas from being supplied to the apparatus.

The Al raw material supply line 21 is constituted of a valve 26, switch valves 28, 29 and a pipe connecting the elements mentioned. An end of the Al raw material supply line is inserted into the Al raw material vessel 22 but not in contact with the Al raw material. The other end thereof is connected to the Al raw material inlet 11 of the shower head 10. The valve 26 plays a role in initiating and terminating the raw material gas supply. The switch valve 28 is responsible for switching a gas flow to a branched bypass line 36. The switch valve 29 is responsible for switching the gas flow to a branched purge line.

To prevent the gasified raw material from returning to a liquid form, the Al raw material vessel 22 is maintained at, e.g., 25° C. and the gas supply pipe of the Al raw material supply line 21 is maintained at e.g., 35° C.

The bubbling line 25 is constituted of a gas source 24, a valve 30, a mass-flow controller 27, a switch valve 31, and a pipe connecting the elements mentioned. As the gas source 24, use may be made of, for example, a gas cylinder which is filled with a carrier gas ($H_2$) for use in bubbling. The valve 30 is responsible for initiating and terminating the carrier-gas supply. The mass-flow controller 27 is responsible for controlling the flow rate of the Al raw material gas, which is generated by controlling a flow rate of the carrier gas. The switch valve 31 plays a role in switching the gas flow from a main pipe to a branched bypass line 36. The open end of the gas pipe is inserted into DMAH contained in the Al raw material vessel 22.

It is preferable that the same type of gas should be used as the purge gas (to be supplied to the purge line 32) and as the carrier gas for use in bubbling. For example, $H_2$ gas is preferable.

The purge line 32 is constituted of a purge gas source 33, a valve 34, a mass-flow controller 35, and a pipe connecting the elements mentioned. An end of the purge line 32 is connected to the switching valve 29. As the purge gas source 33, use may be made of a gas cylinder which is filled with $H_2$ gas. The valve 34 is responsible for initiating and terminating the carrier-gas supply. The mass-flow controller 35 plays a role in controlling the flow rate of the purge gas.

The bypass line 36 is constituted of a pipe line branched from the switching valve 28 of the Al raw material supply line 21 and a pipe line branched from the switching valve 31 of the bubbling line 25, and the branched lines are merged into an exhausting pipe, which is further connected to the evacuation system.

Now, the Cu raw material supply system 40 will be explained with reference to FIG. 3.

The Cu raw material supply system 40 has a Cu raw material supply line 41 and a Cu raw material vessel 42. The Cu raw material supply line 41 is connected to the Cu raw material inlet 12 of the shower head 10 and responsible for supplying the Cu raw material. The Cu raw material vessel 42 is filled with a Cu raw material such as cyclopentadienylcoppertriethylphosphine (CpCuTEP). Since CpCuTEP is a solid material, CpCuTEP is coated over a plurality of spherical bodies, which are accommodated in the Cu raw material vessel 42 in this embodiment.

Furthermore, since CpCuTEP is present in a solid form at normal temperature, a heater is provided in the Cu raw material vessel 42 to heat CpCuTEP. The Cu raw material supply system is constituted of a gasification line 45, a purge line 52, and a bypass line 56. The gasification line 45 plays a role in introducing $H_2$ gas into the vessel 42 to gasify CpCuTEP, thereby producing the Cu raw material gas. The purge line is responsible not only for purging the raw material gas left in the Cu raw material supply line 41 and in the chamber 1 but also for introducing a gas before the raw material gas is introduced into the chamber 1 to control the inner pressure thereof. The bypass line 56 is branched from the gasification line 45 and the purge line 52, and plays a role in exhausting the raw material gas to prevent the raw material gas from being supplied to the apparatus.

The Cu raw material supply line 41, one end of which is inserted into the Cu raw material contained in the Cu raw material vessel 42, and the other end of which is connected to the Cu raw material inlet 12 of the shower head 10. The Cu raw material supply line 41 is constituted of a valve 46, switching valves 48, 49, and a pipe connecting the elements mentioned. The valve 46 is responsible for initiating and terminating the Cu raw material supply. The switching valves 48 and 49 play a role in switching the flow into a branched bypass line 56 and a branched purge line 52, respectively.

Note that a heater 58 is provided in the periphery of the Cu raw material supply line 41, extending from the Cu raw material vessel 42 to the chamber 1. The Cu raw material supply line 41 is heated by the heater 58 to a predetermined temperature, e.g., 75° C. On the other hand, a heater 59 is provided in the periphery of the carrier gas pipe 45. The gas pipe 45 is heated to a predetermined temperature, e.g., 65° C. Furthermore, the Cu raw material vessel 43 is heated by a heater 60 to a predetermined temperature, e.g., 65° C.

The gasification line 45 is constituted of a gas supply source 44, a valve 50, a mass flow controller 47, a switch valve 51, and a pipe connecting the elements mentioned. As the gas supply source 44, use may be made of, for example, a gas cylinder which is filled with a carrier gas ($H_2$). The valve 50 is responsible for initiating and terminating the carrier gas supply. The mass-flow controller 47 controls a flow rate of the raw material gas, which is generated by controlling a flow rate of the carrier gas. The switching valve 51 plays a role in switching the flow into the branched bypass line 56. The open end of the gasification line 45 is inserted into the Cu raw material vessel 42 but not in contact with the Cu raw material.

The purge line 52 is constituted of a purge gas source 53, a valve 54, a mass-flow controller 55, and a pipe connecting the elements mentioned. As the purge gas source 53, use may be made of, for example, a gas cylinder which is filled with gas ($H_2$). The valve 54 is responsible for initiating and terminating purge gas supply. The mass-flow controller plays a role in detecting a flow rate of the purge gas. The purge line 52 is connected to the switching valve 49.

It is preferable that the same type of gas should be used as the purge gas (to be supplied to the purge line 52) and as the carrier gas for use in bubbling. For example, $H_2$ gas is preferable.

The bypass line 56 is constituted of a pipe line branched from the switching valve 48 of the Cu raw material supply line 41 and a pipe line branched from the switching valve 51 of the bubbling line 45, and the branched lines are merged into the exhausting pipe which is further connected to the evacuation system 9.

In the CVD apparatus having the Al raw material supply system 40 and the Cu raw material supply system 40, an Al raw material gas (DMAH) is supplied into the chamber 1 from the Al raw material supply line 21 when an Al film is formed. At this time, the switching valve 48 is opened and the switching valve 49 is closed. By virtue of these operation, the Cu raw material gas is led into a branched bypass line 56 and exhausted from the exhausting system 9. The Cu raw material gas is therefore successfully prevented from being introduced into the chamber 1.

When the Cu film is formed, the Cu raw material gas (CpCuTEP) is supplied from the Cu raw material supply line 41 to the chamber 1. At this time, the switching valve 28 is opened and the switching valve 29 is closed. By virtue of these operations, the Al raw material gas is led into the branched bypass line 36 and exhausted from the exhausting system 9. The Al raw material gas is therefore successfully prevented from being introduced into the chamber 1.

Next, we will explain the method of forming an Al/Cu multilayered film by using the CVD apparatus according to this embodiment.

The chamber 1 (under atmospheric pressure) is drawn by a vacuum pump through the exhausting system 9 to obtain a highly-vacuumed state. While this state is maintained, a semiconductor wafer W having a TiN film formed on the substrate surface is loaded into the chamber 1 from the loadlock chamber (not shown) and set on the susceptor 2. Then, the semiconductor wafer W is heated to 190° C. by the heater 5 embedded in the susceptor 2.

Subsequently, $H_2$ gas is introduced into the chamber 1 from both or either of the purge gas sources 33, 53 at a flow rate of, e.g, 1000 SCCM, by operating the switch valves 29 and 49. As a result, the degree of vacuum of the chamber 1 is adjusted at, e.g, 5 Torr.

At the same time, $H_2$ gas is supplied into the bypass lines 36, 56 at a flow rate of 1000 SCCM from the gas supply sources 24, 44 by operating the switching valves 31, 51, 28 and 48.

At this time, pressures inside the pipe lines upstream of pressure controllers (not shown), which are respectively fitted on the Al raw material supply line 21 and the Cu raw material supply line 41, are controlled equal to those of the raw material vessels 22 and 42 by means of the pressure controllers.

In this case, the pressure of the Al raw material vessel 22 is set at, e.g., 100 Torr. The pressure of the Cu raw material vessel 42 is set at, e.g., 160 Torr.

After the pressure is stabilized, the carrier gas is supplied into the Al raw material vessel 22 and the Cu raw material vessel 42 from the bypass lines 36, 56 respectively by operating the switch valves 31, 51.

DMAH (Al raw material) is bubbled and gasified by the aforementioned operation. The gasified DMAH is sent to the Al raw material supply line 21 together with a carrier gas ($H_2$). The DMAH flow is switched into the branched bypass line 36 by the operation of the switch valve 28. In this manner, DMAH is exhausted from the bypass line 36. In the same manner, CpCuTEP (Cu raw material) is gasified and sent to the Cu raw material supply line 41 together with the carrier gas ($H_2$). The CpCuTEP flow is switched into the branched bypass line 56 by the operation of the switch valve 48, and then exhausted.

When a chamber pressure is stabilized and temperature of the semiconductor wafer reaches a predetermined value, the raw material gas is supplied into the chamber 1 by operating either switch valves 28 and 29 or switch valves 48 and 49. In this way, film formation is started. The Al film may be formed first or the Cu film may be formed first.

Now, we will explain the case where the Cu film is formed after the Al film is formed in accordance with the aforementioned process. When the film is formed, temperature of the wall portion of the chamber 1 is set at, e.g., 50° C. to prevent an extra film from being deposited.

By virtue of the aforementioned operation, the carrier gas is supplied into the chamber 1 via the switch valve 29 and the Al raw material gas is supplied into the branched bypass line 36. Similarly, the Cu raw material gas is supplied into the bypass line 56 via the switch valve 48.

While the supply of the $H_2$ gas into the chamber 1 is terminated by operating switch valves 28 and 29, the Al raw material gas (DMAH+$H_2$) flowing into the bypass line 36 is then changed to flow into the chamber 1. The Cu raw material gas (CpCuTEP+$H_2$) is supplied into the bypass line 56.

At that time, a flow rate of the $H_2$ gas (carrier gas) is set at, e.g., 1000 SCCM. An inner pressure and temperature of the Al raw material vessel 22 are set at about 100 Torr and about 65° C., respectively. Temperature of the Al raw material supply line 21 is set at, e.g., 35° C.

In this way, a first Al film is formed on the semiconductor wafer W 45.

A predetermined time after the first Al film is formed in a predetermined thickness, the switch valve 28 is operated. The Al raw material gas flowing into the chamber 1 through the Al raw material supply line 21 is switched to flow into the bypass line 36. In this manner, the Al raw material gas is exhausted.

Thereafter, the switch valve 48 is operated to supply the Cu raw material gas, which has been supplied to the bypass line 56, into the chamber 1.

The switch valves 28 and 48 may be operated either simultaneously or separately. To be more specific, after the Al raw material gas flow is switched to the bypass line 36, the Cu raw material gas may be supplied into the chamber 1. Note that if the Al raw material gas is co-present with the Cu raw material gas in the chamber 1, the gases may react with each other and generate a reaction product. To prevent the reaction, it is preferred to employ either a method in which the chamber 1 is purged with $H_2$ gas supplied from the purge gas source 33 after the Al raw material gas flow is switched to the bypass line 36, or a method in which after the Al raw material gas is exhausted by a vacuum pump, the Cu raw material gas is supplied into the chamber 1. In the opposite case where the Cu raw material gas is supplied before the Al raw material gas, the switching operation of the supplied gas may be carried out in the similar manner.

When the Cu raw material gas is supplied in place of the Al raw material gas, $H_2$ gas (carrier gas) is supplied at a flow rate of e.g., 1000 SCCM. Inner pressure and temperature of the Cu raw material vessel 42 are set at about 100 Torr and about 65° C., respectively. Temperature of the gasification line 45 is set at about 65° C. Temperature of the Cu raw material supply line 41 is set at about 75° C.

After a first Cu film is formed on the first Al film in a desired thickness under these conditions, the Cu raw material gas is supplied into the bypass line 56 by the operation of the switch valve 48. In this way, the Cu film formation step is terminated.

Then, to form a second Al film, the Al raw material gas is supplied into the chamber 1 switching from the bypass line 36 by the operation of the switch valve 28. In this way, the second Al film is formed on the first Cu film.

If the aforementioned operations are repeatedly performed, it is possible to form Al/Cu multilayered film in which the Al film and Cu film are alternately stacked in a desired layer-number.

When a series of film-formation processes is terminated, the valves 30, 50 are first operated to stop the carrier gas. Then, switch valves 31, 51 are operated to exhaust the carrier gas left in the pipe.

Thereafter, the chamber 1 is drawn by a vacuum pump to a high degree of vacuum, thereby exhausting the remaining gas. Alternatively, the chamber 1 may be drawn by a vacuum pump after post flow is performed for a predetermined time period by introducing $H_2$ gas into the chamber 1 from the purge gas sources 33, 53 and terminating the $H_2$ gas supply by the operation of the switch valves 29, 49.

The Al/Cu multilayered film thus formed on the semiconductor wafer W is subjected to an annealing step under predetermined conditions. The annealing treatment induces diffusion between the Al film and the Cu film. As a result, a desired Al/Cu alloy film is formed.

The multilayered film is formed under the typical film formation conditions below.

First, the substrate is heated to 190° C. and inner pressure of the chamber 1 is set at 5 Torr. Then, the Al raw material (DMAH) is supplied together with $H_2$ gas (carrier gas) at a flow rate of 1000 SCCM for 234 seconds by use of a bubbler (Step (1)). The pressure at an outlet of the bubbler is 100 Torr and a vapor pressure of DMAH at room temperature is about 2 Torr. Thereafter, $H_2$ gas serving as a purge gas is supplied at a flow rate of 1000 SCCM for 20 seconds (Step (2)), and then, CpCuTEP gas (Cu raw material gas) set at 80° C., 100 Torr, is supplied for 60 seconds together with $H_2$ carrier gas (Step (3)). Subsequently, $H_2$ purge gas is supplied for 20 seconds at 1000 SCCM (Step (4)). A series of steps (1) to (4) is repeated 7 times. In this manner, an Al/Cu multilayered film having an overall thickness of 25,000 Å is formed. The obtained multilayered film is then subjected to an annealing step performed at 400° C. for 30 minutes under an hydrogen atmosphere. As a result, an Al/Cu alloy film is obtained.

In the case where the alloy film is formed from the multilayered film in which the Al film and the Cu film are stacked one upon the other a plurality of times, it is generally preferable that a single film should be formed in a thickness of about 2000 Å or less. In view of smoothness of each film, it is preferred to set the thickness of the single film at about 500 Å; however, the film formation step is inevitably repeated more. This means that the throughput decreases. Hence, most preferably, the thickness of the single film is within the range of 1000 to 2000 Å.

As explained in the foregoing, according to the CVD apparatus of this embodiment, it is possible to form the Al/Cu multilayered film in a single chamber. This is because the Al film (made of the Al raw material gas) and the Cu film (made of the Cu raw material gas) can be formed independently and alternately in the same chamber. Hence, the Al/Cu multilayered film is formed with a high throughput and without increasing the size of the manufacturing apparatus.

The Al raw material supply line and Cu raw material supply line are independently connected to the shower head, passed through the shower head without merging, and connected to the chamber. Hence, there is little possibility for the Al raw material to react with the Cu raw material.

Furthermore, there are provided a first bypass line (for exhausting the Al raw material gas) and a second bypass line (for exhausting the Cu raw material gas) bypassing the chamber. Hence, when the Al raw material gas is introduced into the chamber through the Al raw material supply line, the Cu raw material gas is introduced into thesecond bypass line. Whereas, when the Cu raw material gas is introduced into the chamber through the Cu raw material supply line, the Al raw material gas is introduced into the first bypass line. In this way, it is possible to prevent the reaction between the Al raw material and the Cu raw material.

In this embodiment, since the aforementioned materials are chosen as raw materials, both Al film and Cu film may be formed on the semiconductor wafer W set at the same temperature. Therefore, while the susceptor is kept at the same temperature by the heater, the films can be formed continuously. It is therefore possible to increase the throughput.

Note that the present invention is not limited to the aforementioned embodiments and may be modified in various ways. In the embodiments, the raw materials gases are supplied from raw material supply orifices arranged in a matrix shower form in the head shower which is positioned in the upper portion of the chamber. However, the supply means for the raw materials is not limited to this. Any supply means may be used as long as the Al raw material and Cu raw material can be supplied independently. For example, use may be made of two ring-form supply means having numerous gas spurting-out holes.

Furthermore, it is not necessary to use a bubbling scheme to gasify the raw material. A predetermined amount of a liquid material may be directly gasified by using a liquid mass-flow controller. The carrier gas and the purge gas are not limited to $H_2$ gas. An inert gas such as Ar may be used.

Now, we will explain an modified embodiment of the Cu raw material supply system 40 with reference to FIG. 4. In the aforementioned Cu raw material supply system 40, cyclopentadienylcopperethylphosphine (CpCuTEP) is employed, whereas, a liquid Cu material is used in the Cu raw material supply system of the modified embodiment.

Figure 3:
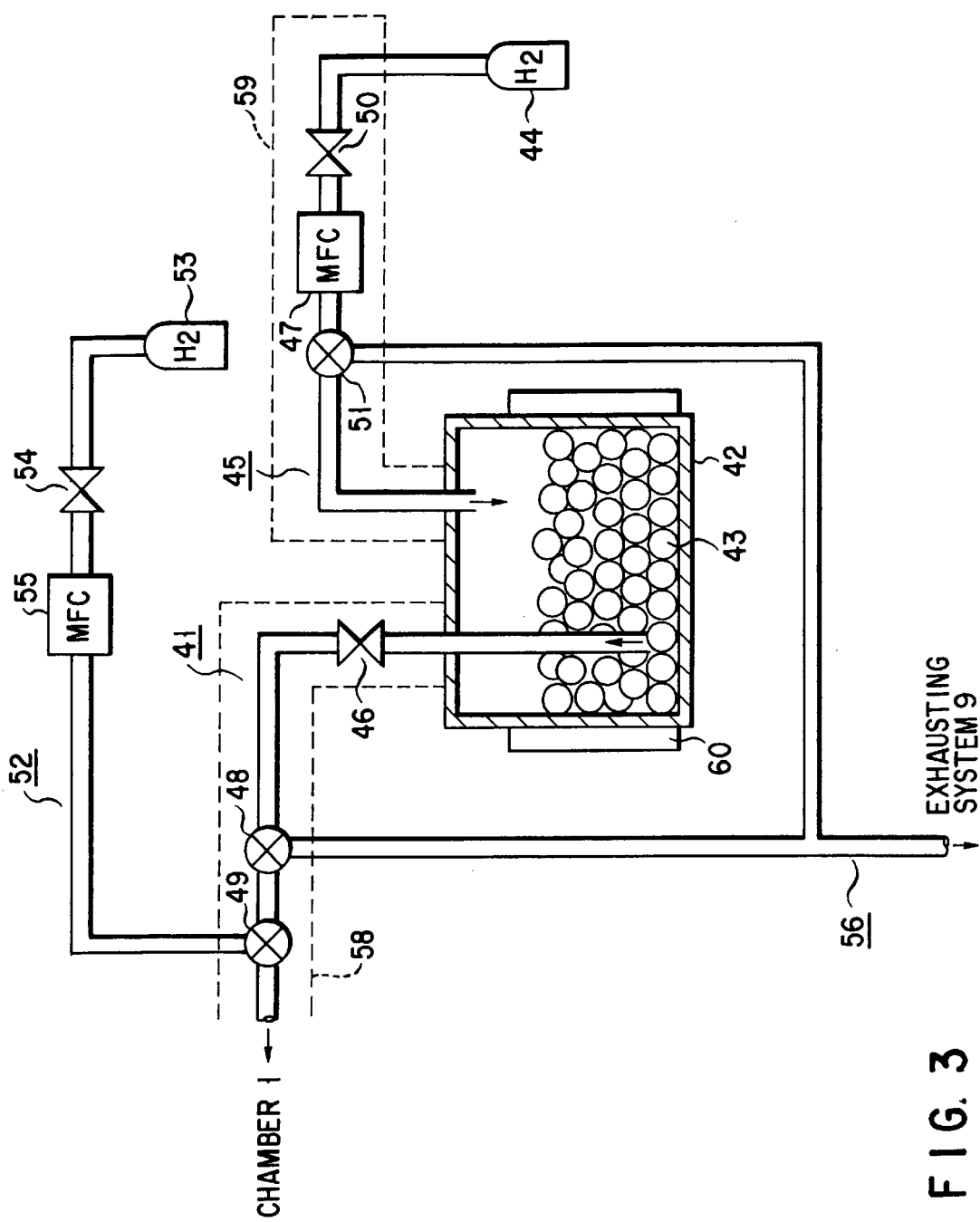
FIG. 3 is a view showing a Cu raw material supply system for supplying Cu gas into the CVD apparatus shown in FIG. 1.

A Cu raw material vessel of the modified embodiment differs in structure from that shown in FIG. 3. Like reference numerals are used to designate like structural elements corresponding to those in FIG. 3 and any further explanation is omitted for brevity's sake.

As the liquid Cu raw material, hexafluoroacetylacetonatetrymethylvinylsilylcopper (hfacCuVTMS) 62 is used.

Liquid-form hfacCuVTMS 62 contained in a Cu raw material vessel 61 is gasified by bubbling and supplied to a Cu raw material supply line 41 in the same manner as in the Al raw material supply system 20. $H_2$ gas serving as the carrier gas for use in bubbling is supplied from a gas supply source 44 through a carrier gas pipe 45 to the Al raw material vessel 61. Upon supplying $H_2$ gas, hfacCuVTMS 62 is bubbled and pressure-supplied through the pipe 41 into the chamber 1.

As the Al raw material and the Cu raw material, the aforementioned combination is preferable. However, they are not limited to the aforementioned combination. Various combinations may be employed.

For example, as the Al raw material, there are triisobutylaluminium (TIBA), dimethylethylaminoalane (DMEAA), trimethylaminealane (TMAA), trimethylaluminium (TMA) and the like.

As the Cu raw material, there are cyclopentadienylcoppertrimethylphosphine (CpCuTMP), cyclopentadienylcoppertriisopropylphosphine (CpCuTIPP), ethylcyclopentadienylcoppertriethylphosphine (EtCpCuTEP) and the like.

Furthermore, conditions including temperature, pressure at the time of the film-formation may be appropriately set depending upon a film to be obtained.

In this embodiment, the Al film is first formed on the semiconductor substrate and then the Cu film is formed. However, the Cu film may be formed first before the Al film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CVD method of forming a film from a raw material gas on a surface of an object to be processed, comprising the steps of:
    a) alternately introducing each of a gasified Al raw material gas and a Cu raw material gas into a bypass line, and then passing the gasified Al raw material gas and the Cu raw material gas into the atmosphere after the respective gasified Al raw material and the Cu raw material gas are stabilized, to thereby form an Al/Cu lamination film in which an Al film and a Cu film are alternately stacked on the surface of the object; and
    b) performing annealing processing on the Al/Cu lamination film, thereby effecting diffusion between the Al film and the Cu film, and forming an Al/Cu alloy film.

2. The CVD method of claim 1, wherein the Al/Cu multilayered film is formed by first forming the Cu film, and then forming the Al film.

3. The CVD method of claim 1, wherein, in step a) after the Al film formation is completed and before the Cu film formation is started, the atmosphere is purged to completely exhaust the Al raw material gas and then Cu raw material gas is introduced, or after the Cu film formation is completed and before the Al film formation is started, the atmosphere is purged to completely exhaust the Cu raw material gas and then the Al raw material is introduced, to prevent the Al raw material gas and the Cu raw material gas from being present simultaneously in the atmosphere.

4. The CVD method of claim 1, wherein said Al raw material comprises trisobutylaluminum, dimethylethylaminoalane, trimethylaminealane, trimethylaluminum or dimethylaluminum hidride.

5. The CVD method of claim 1, wherein said Cu raw material comprises cyclopentadienylcoppertriisopropylphosphine, cyclopentadienylcoppertrimethylphosphine, or ethylcyclopentadienylcoppertriethylphosphine.

6. The CVD method of claim 1, wherein the Al film and the Cu film are formed at substantially the same temperature.

7. The CVD method of claim 1, wherein the Al raw material gas and the Cu raw material gas are gasified by bubbling and liquid mass flow.

8. The CVD method of claim 1, wherein a carrier gas selected from the group consisting of an inert gas and $H_2$ gas is used for making the gasified Al raw material gas and the Cu raw material gas flow into respective pipelines and reach the bypass line.

9. The CVD method of claim 1, wherein the gasified Al raw material gas and the Cu raw material gas are introduced into a chamber by respective gas supply systems which are provided independently.

10. The CVD method of claim 1, wherein the Cu raw material gas is selected from the group consisting of hexafluoroacetylacetonate-tetramethylvinylsilyl copper and liquid ethylcyclopentadienylcoppertriethylphosphine.

* * * * *